(12) United States Patent
Noguchi et al.

(10) Patent No.: US 8,021,936 B2
(45) Date of Patent: Sep. 20, 2011

(54) METHOD OF MANUFACTURING THIN FILM TRANSISTOR

(75) Inventors: Takashi Noguchi, Seongnam-si (KR); Wenxu Xianyu, Yongin-si (KR); Hans S. Cho, Seoul (KR); Huaxiang Yin, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 225 days.

(21) Appl. No.: 12/382,925

(22) Filed: Mar. 26, 2009

(65) Prior Publication Data

US 2009/0191673 A1   Jul. 30, 2009

Related U.S. Application Data

(62) Division of application No. 11/248,620, filed on Oct. 13, 2005, now Pat. No. 7,511,381.

(30) Foreign Application Priority Data

Oct. 13, 2004   (KR) ................ 10-2004-0081760

(51) Int. Cl.
*H01L 21/00* (2006.01)
*H01L 21/84* (2006.01)

(52) U.S. Cl. ........ 438/149; 438/347; 438/483; 438/510; 438/781; 257/E21.051; 257/E21.077; 257/E21.17; 257/E21.151; 257/E21.134; 257/E21.248; 257/E21.278; 257/E21.304; 257/E21.32; 257/E21.347; 257/E21.562

(58) Field of Classification Search ............... 438/197, 438/96, 149, 347, 308, 483, 506, 509, 510, 438/680, 692, 723, 724, 781; 257/E21.051, 257/77, 151, 134, 17, 248, 278, 304, 32, 257/347, 562

See application file for complete search history.

(56) References Cited

U.S. PATENT DOCUMENTS

| | | | |
|---|---|---|---|
| 5,397,718 A | 3/1995 | Furuta et al. | |
| 5,426,064 A | 6/1995 | Zhang et al. | |
| 5,523,257 A | 6/1996 | Yamazaki et al. | |
| 5,569,610 A | 10/1996 | Zhang et al. | |
| 5,650,637 A | 7/1997 | Kodaira et al. | |
| 5,731,613 A | 3/1998 | Yamazaki et al. | |
| 5,851,860 A * | 12/1998 | Makita et al. | ........ 438/166 |
| 6,316,790 B1 | 11/2001 | Kodaira et al. | |
| 6,346,717 B1 | 2/2002 | Kawata | |
| 6,399,429 B1 | 6/2002 | Yamoto et al. | |
| 6,600,231 B2 | 7/2003 | Tominaga | |
| 7,511,381 B2 * | 3/2009 | Noguchi et al. | ........ 257/780 |

FOREIGN PATENT DOCUMENTS

| | | |
|---|---|---|
| CN | 1 295 348 A | 5/2001 |
| JP | 58-060697 A | 4/1983 |
| JP | 06-163407 A | 6/1994 |
| JP | 08-032074 A | 2/1996 |
| JP | 09-102610 A | 4/1997 |
| JP | 2002-299236 A | 10/2002 |

* cited by examiner

*Primary Examiner* — David Nhu
(74) *Attorney, Agent, or Firm* — Lee & Morse, P.C.

(57) ABSTRACT

A thin film transistor (TFT) and a method of manufacturing the same are provided. The TFT includes a transparent substrate, an insulating layer on a region of the transparent substrate, a monocrystalline silicon layer, which includes source, drain, and channel regions, on the insulating layer and a gate insulating film and a gate electrode on the channel region of the monocrystalline silicon layer.

9 Claims, 7 Drawing Sheets

METHOD OF MANUFACTURING THIN FILM TRANSISTOR

CROSS REFERENCE TO RELATED APPLICATION

This is a divisional application based on application Ser. No. 11/248,620, filed Oct. 13, 2005, now U.S. Pat. No. 7,511,381 B2, the entire contents of which is hereby incorporated by reference.

BACKGROUND OF THE INVENTION

1. Field of the Invention

The present invention relates to a semiconductor device and a method of manufacturing the same. More particularly, the present invention relates to a thin film transistor (TFT) and a method of manufacturing the same.

2. Description of the Related Art

In a typical TFT used as a switching device for a flat display, e.g., an LCD or an OLED, the channel is formed of amorphous silicon or polycrystalline silicon. When a channel region of a TFT is formed of amorphous silicon, uniformity may be increased, but high speed operation may be difficult due to low carrier mobility. When the channel region is formed of polycrystalline silicon, carrier mobility may be increased as compared to amorphous silicon, but the reduction of the size of the device may be limited by the grain size of the polycrystalline silicon.

A TFT may be formed on a substrate such as a glass substrate or a sapphire substrate. However, using a glass substrate may make it difficult obtain uniform results. Further, the use of a sapphire substrate may result in reduced carrier mobility, as it is difficult to obtain mobility equal to that achieved a system in which there is no compression stress, or tensile stress is applied, since the channel region of a conventional TFT on a sapphire substrate is under a compression stress.

SUMMARY OF THE INVENTION

The present invention is therefore directed to a TFT and a method of manufacturing the same, which substantially overcome one or more of the problems due to the limitations and disadvantages of the related art.

It is therefore a feature of an embodiment of the present invention to provide a TFT formed as a silicon on sapphire device and a method of manufacturing the same.

It is therefore another feature of an embodiment of the present invention to provide a TFT having a monocrystalline channel.

It is therefore a further feature of an embodiment of the present invention to provide a TFT that can be operated at high speeds.

It is therefore yet another feature of an embodiment of the present invention to provide a TFT that can be scaled down.

At least one of the above and other features and advantages of the present invention may be realized by providing a thin film transistor that may include a transparent substrate, an insulating layer on a region of the transparent substrate, a monocrystalline silicon layer, which includes source, drain, and channel regions, on the insulating layer and a gate insulating film and a gate electrode on the channel region of the monocrystalline silicon layer.

The channel region may be interposed between the insulating layer and the gate insulating film and the channel region may have a thickness of up to about 100 nm. The insulating layer may be recessed in the transparent substrate. An upper surface of the transparent substrate may be coplanar with an upper surface of the insulating layer and the upper surface of the transparent substrate is coplanar with a bottom surface of the monocrystalline silicon layer. The insulating layer may project above the transparent substrate. The thin film transistor may further include a second monocrystalline layer adjacent to the insulating layer, wherein an upper surface of the second monocrystalline layer is coplanar with an upper surface of the insulating layer. The insulating layer may be a silicon oxide film or a silicon nitride film. The transparent substrate may be a sapphire substrate having a (1102) face as an upper surface.

At least one of the above and other features and advantages of the present invention may also be realized by providing a method of manufacturing a thin film transistor, which may include providing a transparent substrate, forming an insulating layer on the transparent substrate, forming a monocrystalline silicon layer on the insulating layer, forming a gate insulating layer and a gate electrode on the monocrystalline silicon layer and implanting a dopant into the monocrystalline silicon layer around the gate electrode.

The insulating layer may be in a second region of the transparent substrate and forming the monocrystalline silicon layer on the insulating layer may include forming a first monocrystalline silicon layer on a first region of the transparent substrate, the first region adjacent to the second region, forming an amorphous silicon layer on the first and second regions, transforming the amorphous silicon layer into a second monocrystalline silicon layer and removing the second monocrystalline silicon layer where it overlies the first region. Transforming the amorphous silicon layer into the second monocrystalline silicon layer may include crystallizing the amorphous silicon layer where it overlies the first region and irradiating the crystallized amorphous silicon layer overlying the first region and the amorphous silicon layer overlying the second region. Crystallizing the amorphous silicon layer where it overlies the first region may be performed by vertical solid phase epitaxy. Irradiating the crystallized amorphous silicon layer overlying the first region and the amorphous silicon layer overlying the second region may cause lateral crystallization into the amorphous silicon layer overlying the second region. Transforming the amorphous silicon layer into a second monocrystalline silicon layer may include forming the amorphous silicon layer to a thickness such that a thickness of the second monocrystalline silicon layer where it overlies the second region has a thickness of up to about 100 nm. Forming the insulating layer on the transparent substrate may include forming a recess in the second region of the transparent substrate and filling the recess with the insulating layer. Forming the insulating layer on the transparent substrate may include forming the insulating layer in the second region so that it projects above the first region of the transparent substrate. The insulating layer may be a silicon oxide film or a nitride film. The transparent substrate may be a sapphire substrate having a (1102) face as an upper surface.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF THE INVENTION

Figure 1:
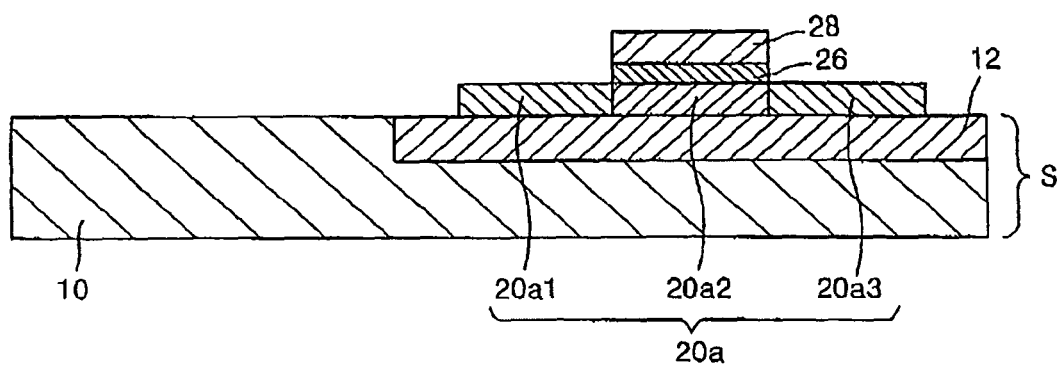
FIGS. 1 and 2 illustrate cross-sectional views of TFTs according to first and second embodiments of the present invention, respectively.

Korean Patent Application No. 10-2004-0081760, filed on Oct. 13, 2004, in the Korean Intellectual Property Office, and entitled: "Thin Film Transistor and Method of Manufacturing the Same," is incorporated by reference herein in its entirety.

The present invention will now be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the figures, the dimensions of layers and regions are exaggerated for clarity of illustration. It will also be understood that when a layer is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

A TFT according to an embodiment of the present invention will now be described. FIG. 1 is a cross-sectional view illustrating a TFT according to a first embodiment of the present invention.

Referring to FIG. 1, a TFT according to the first embodiment of the present invention may be formed on a substrate S, e.g., a silicon on insulator (SOI) substrate including a sapphire substrate 10 and a silicon oxide film 12. The sapphire substrate 10 may be substituted by another suitable transparent substrate and the silicon oxide film 12 may be similarly substituted by other suitable insulating films, e.g., silicon nitride (SiN). Where the substrate 10 is a sapphire substrate, the sapphire substrate may have a (1102) face as its upper surface, i.e., the silicon oxide film 12 may be formed on the (1102) face.

A monocrystalline silicon layer 20a may be present on the SOI substrate S. The monocrystalline silicon layer 20a may include first through third regions 20a1, 20a2 and 20a3. The first region 20a1 may be a source region into which an n-type or a p-type dopant is implanted, the third region 20a3 may be a drain region into which an n-type or a p-type dopant is implanted, and the second region 20a2, interposed between the first and third regions 20a1 and 20a3, may be a channel region. A gate insulating film 26 and a gate electrode 28 may be sequentially formed on the second region 20a2.

Figure 2:
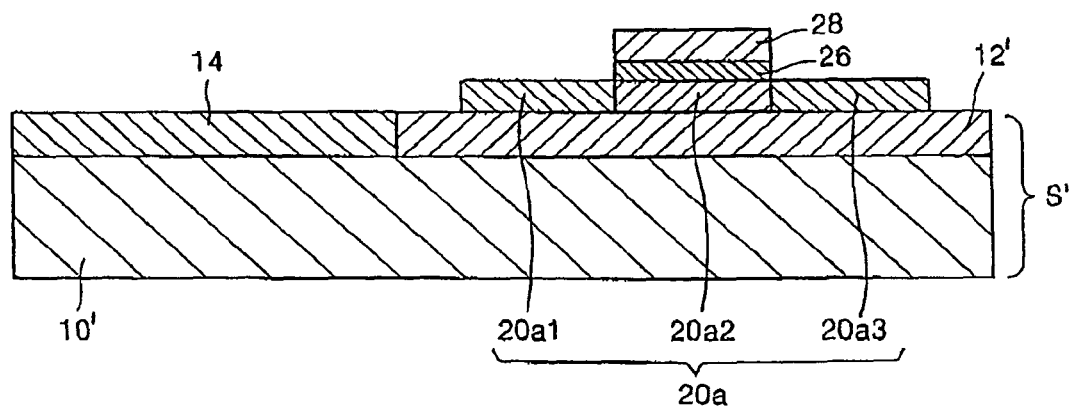

FIG. 2 illustrates a cross-sectional view of a TFT formed on a SOI substrate S' in accordance with a second embodiment of the present invention, in which a silicon oxide film 12' is formed on a predetermined region of a sapphire substrate 10', rather than being formed where a portion of the sapphire substrate has been removed. The silicon oxide film 12 may be provided where a portion of the sapphire substrate 10 has been removed, as shown in FIG. 1, or on a predetermined region of the sapphire substrate 10', as shown in FIG. 2. In other respects, the configuration of other elements may be the same as those shown in FIG. 1.

Figure 3:
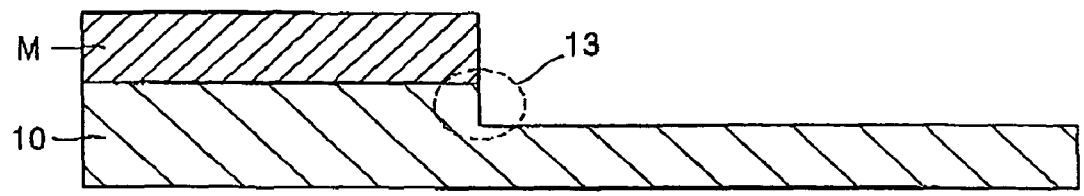
FIGS. 3-12 illustrate cross-sectional views of stages in a method of manufacturing the TFT depicted in FIG. 1.

A method of manufacturing the TFT shown in FIG. 1 will now be described with reference to FIGS. 3-12. Referring to FIG. 3, a region for growing a monocrystalline silicon layer may be defined by forming a mask M on a predetermined region of the sapphire substrate 10, although the sapphire substrate 10 may be substituted by another suitable transparent substrate. The mask M may be a photosensitive film pattern. Next, an upper surface of the sapphire substrate 10, on which the mask M is formed, may be removed, e.g., by etching. Thus, a predetermined portion of the sapphire substrate 10 may removed by the etching, but another predetermined portion of the sapphire substrate 10 covered by the mask M is not affected by the etching. Accordingly, after etching, a step difference 13 corresponding to the removed thickness of the sapphire substrate 10 between the portion covered by the mask M and the portion uncovered by the mask M may be formed.

Figure 4:
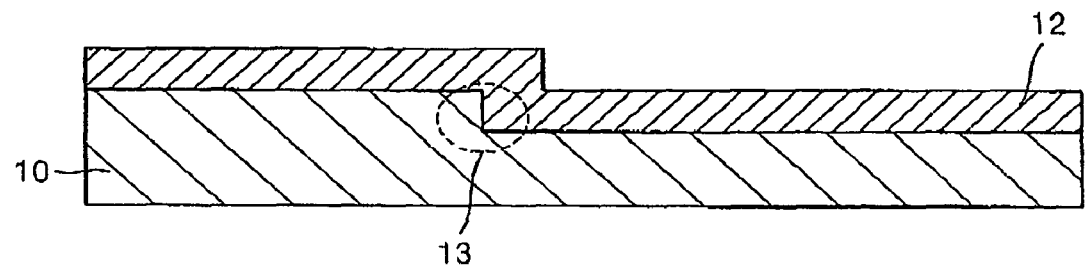
Figure 5:
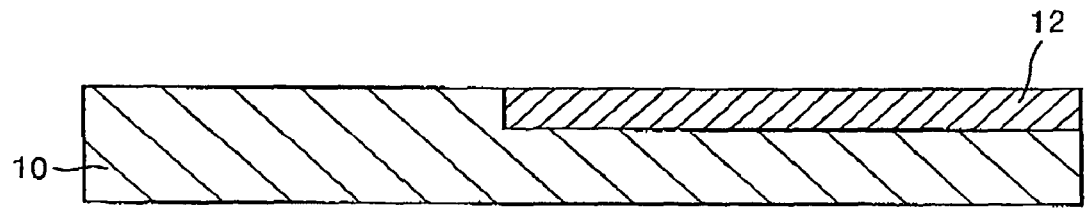

After removing the mask M from the sapphire substrate 10, as depicted in FIG. 4, a silicon oxide ($SiO_2$) film 12 may be formed on the entire surface of the sapphire substrate 10, although other suitable insulating films may also be used, e.g., silicon nitride (SiN). Then, the entire surface of the silicon oxide film 12 may be polished, e.g., using chemical mechanical polishing (CMP). The polishing may be continued until the sapphire substrate 10, in the region corresponding to the region covered by the mask M, is exposed. As the result of polishing, as depicted in FIG. 5, a surface of the resultant product may be planarized such that the low portion of the sapphire substrate 10 is filled with the silicon oxide film 12.

Figure 6:
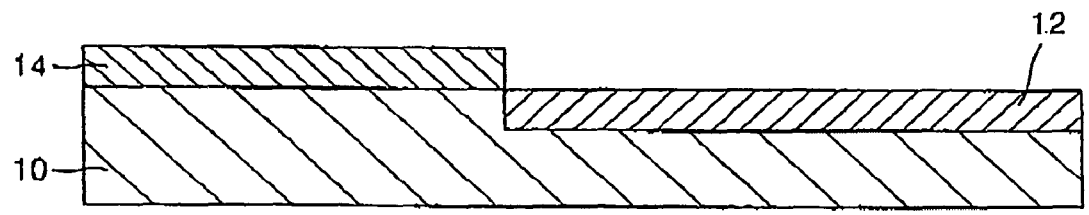

A selective epitaxy process may be performed next to form a monocrystalline silicon layer 14. The selective epitaxy process may be performed using, e.g., ultra high vacuum CVD. The monocrystalline silicon layer 14 is not formed on the silicon oxide film 12 by the selective epitaxy process, since extra silicon Si to be reacted with oxygen is not present in the silicon oxide film 12. Accordingly, as depicted in FIG. 6, the monocrystalline silicon layer 14 may be selectively formed only on the predetermined region of the sapphire substrate 10 on which the mask M was formed.

Figure 7:
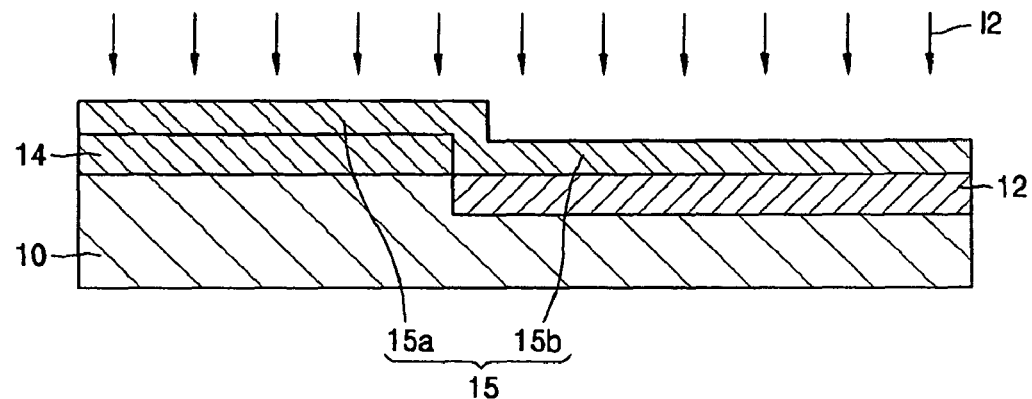

Referring to FIG. 7, an amorphous silicon layer 15 covering the monocrystalline silicon layer 14 may be grown by, e.g., low pressure CVD at a temperature range of 500-750° C., preferably 550° C., or other deposition methods. The amorphous silicon layer 15 may be formed to a predetermined thickness, e.g., greater than 50 nm. In a subsequent step, the amorphous silicon layer 15 may be transformed into a monocrystalline layer. Accordingly, the thickness of the amorphous silicon layer 15 will affect the thickness of the subsequently produced monocrystalline layer.

For convenience of explanation, the amorphous silicon layer 15 is illustrated as being divided into a first portion 15a, which covers the monocrystalline silicon layer 14, and a second portion 15b, which covers the silicon oxide film 12. A step difference, caused by the thickness of the monocrystalline silicon layer 14, may be formed between the first and second portions 15a, 15b.

Polycrystalline silicon may be locally present in the amorphous silicon layer 15 formed by the method described above. If present in the amorphous silicon layer 15, polycrystalline silicon may affect the formation of the amorphous silicon layer 15. Therefore, any polycrystalline silicon present in the amorphous silicon layer 15 is preferably removed. To remove the polycrystalline silicon, silicon may be doped on the entire surface of the amorphous silicon layer 15, as indicated by ion doping process I2 in FIG. 7. Localized polycrystalline silicon regions in the amorphous silicon layer 15 may thus be removed by the ion doping I2, such that the entire amorphous silicon layer 15 may achieve a uniform amorphous state.

Figure 8:
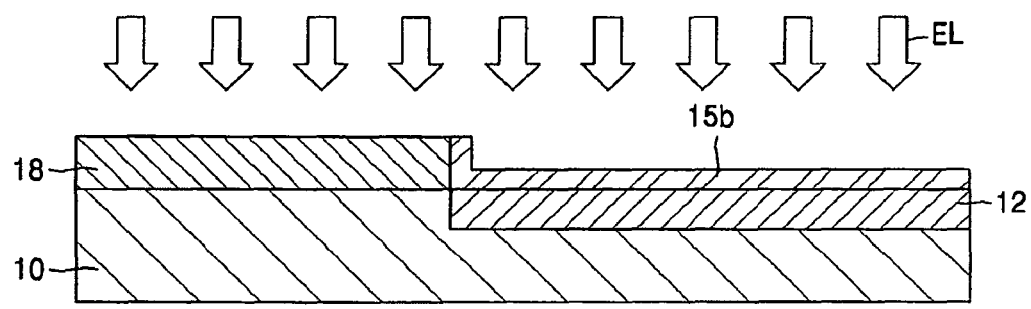

Next, a vertical solid phase epitaxy process may be performed on the resultant product. The vertical solid phase epitaxy process may be performed at a temperature range of 600-900° C. The first portion 15a of the amorphous silicon layer 15 may be crystallized by the vertical solid phase epitaxy process. As the result, as shown in FIG. 8, a monocrystalline silicon layer 18, having a greater thickness than the monocrystalline silicon layer 14 illustrated in FIG. 7, may be formed on a region of the sapphire substrate 10 on which the silicon oxide film 12 is not formed. That is, monocrystalline silicon layer 18 may be formed on the region of the substrate 10 that was formerly covered by the mask M.

Figure 9:
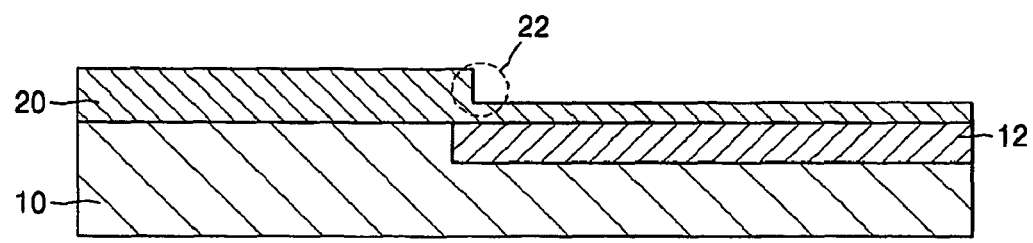

Referring to FIG. 8, lateral crystallization using, e.g., an excimer laser EL such as that generated by a XeCL or KrF source, may next be performed. The laser EL may be used to irradiate the entire surfaces of the monocrystalline silicon layer 18 and the second portion 15b of the amorphous silicon layer 15. Lateral crystallization may occur on the second portion 15b of the amorphous silicon layer 15 during the irradiation. The lateral crystallization of the second portion 15b may progress into the second portion 15b, i.e., toward the right hand side of FIG. 9, from a boundary of the monocrystalline silicon layer 18. Thus, the entire upper surface of the silicon oxide film 12 may be covered by a monocrystalline silicon layer 20, as illustrated in FIG. 9.

Figure 10:
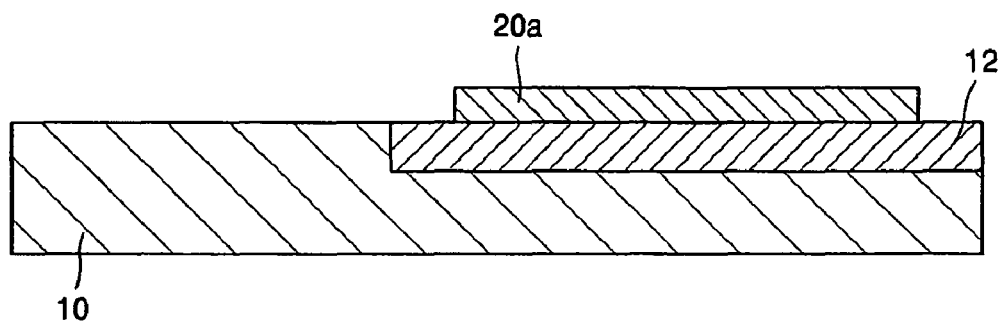

A step difference 22 may be present on the monocrystalline silicon layer 20 between a portion formed on the sapphire substrate 10 and a portion covering the entire upper surface of the silicon oxide film 12. The step difference 22 may correspond to the thickness of the monocrystalline silicon layer 14 in FIG. 6. Note, however, that the presence of the step difference 22 may be addressed by removing a portion of the monocrystalline silicon layer 20 through a subsequent process. More specifically, the monocrystalline silicon layer 20, except the portion formed on the predetermined region of the silicon oxide film 12, may be removed through, e.g., lithography etching, etc. Thus, a monocrystalline silicon island 20a may be formed on a predetermined portion of the silicon oxide film 12, as depicted in FIG. 10. The monocrystalline silicon island 20a may have a thickness of up to about 100 nm.

Figure 11:
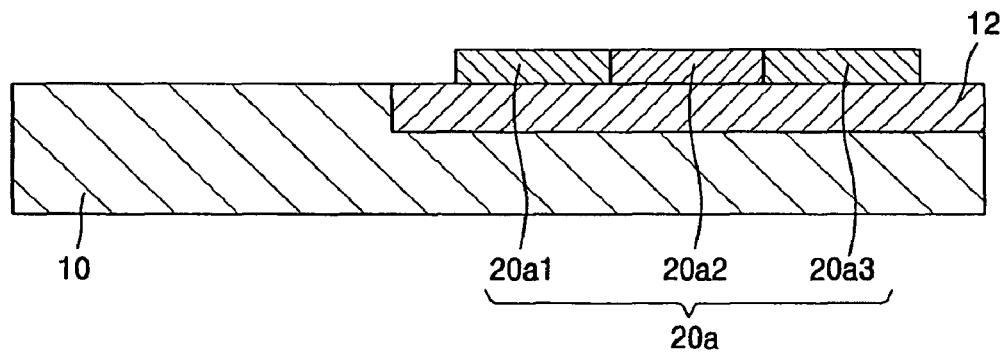

Referring to FIG. 11, the monocrystalline silicon island 20a may be used to form first, second and third regions 20a1, 20a2 and 20a3, as described below. The second region 20a2 may be disposed between the first and third regions 20a1, 20a3. One of the first and the third regions 20a1, 20a3, may be used as a source region and the other region may be used as a drain region. For convenience of explanation, the first region 20a1 will be referred to as a source region and the third region 20a3 as a drain region, although the two may, of course, be exchanged. The second region 20a2 may serve as a channel region.

Figure 12:
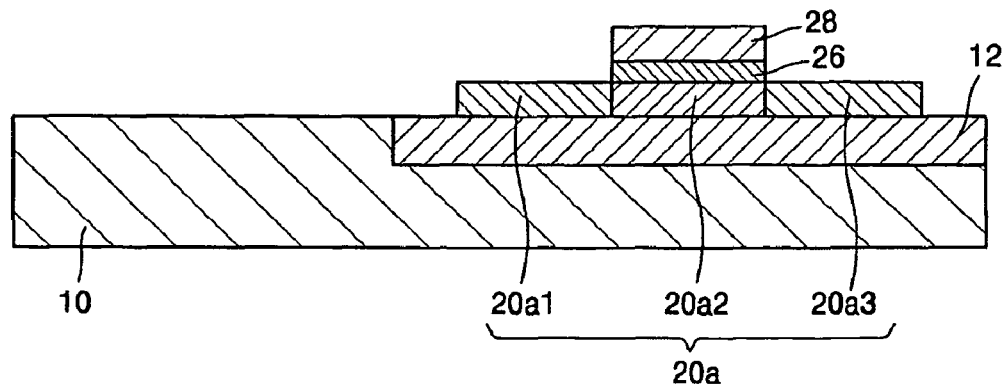

In detail, referring to FIG. 12, a gate insulating film 26 and a gate electrode 28 may be formed on the second region 20a2 and a dopant may be implanted into the first and third regions 20a1 and 20a3. If the TFT to be formed is a p-type TFT, a p-type dopant may be implanted into the first and third regions 20a1, 20a3, while if the TFT is to be n-type, an n-type dopant may be implanted into the first and third regions 20a1, 20a3.

In this way, a TFT that uses monocrystalline silicon as a channel may be formed on the SOI substrate S, which includes the silicon oxide film 12 and the sapphire substrate 10. The TFT has a tensile stress applied thereto, unlike in the conventional art, since the TFT uses a monocrystalline silicon layer as a channel. Therefore TFT may be capable of high speed operation, since the carrier, e.g., electrons for an N-type TFT, may be increased as compared to a conventional silicon on sapphire (SOS) device.

Figure 13:
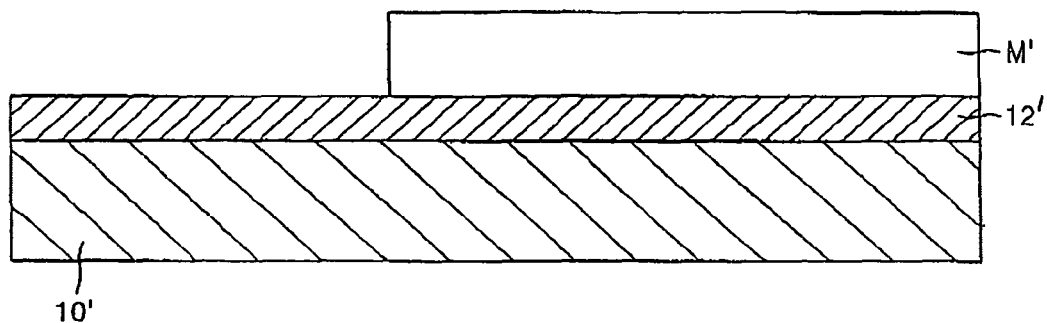
FIGS. 13-20 illustrate cross-sectional views of stages in a method of manufacturing the TFT depicted in FIG. 2.
Figure 14:
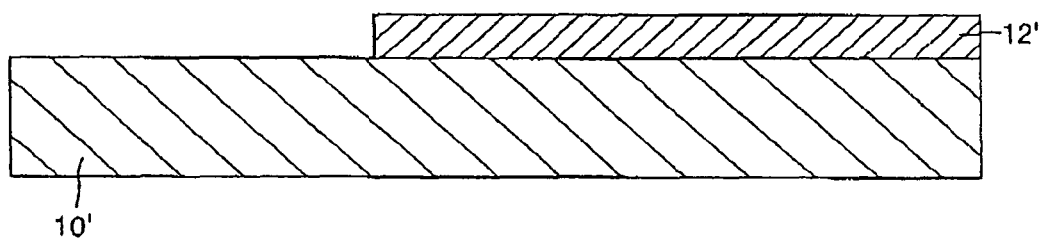

A method of manufacturing the TFT according to a second embodiment will now be described with reference to FIGS. 13-20. Referring to FIG. 13, a silicon oxide film 12' may be formed on an upper surface of a sapphire substrate 10'. A mask M' may be formed on a predetermined region of the silicon oxide film 12'. The mask M' may define a region for forming a monocrystalline silicon layer on an upper surface of the sapphire substrate 10' and may be a photosensitive pattern. After forming the mask M', the entire exposed surface of the silicon oxide film 12' may be removed, e.g., by etching. The etching may be continued until the upper surface of the sapphire substrate 10' is exposed at the region not protected by the mask M'. The silicon oxide film 12' formed on the sapphire substrate 10', except where covered by the mask M', may be removed by the etching. Accordingly, the upper surface of the sapphire substrate 10', except where covered by the mask M', may be exposed by the etching. Referring to FIG. 14, the mask M' may be removed, leaving a portion of the sapphire substrate 10' covered by the silicon oxide film 12' and the rest of the sapphire substrate 10' exposed.

Figure 15:
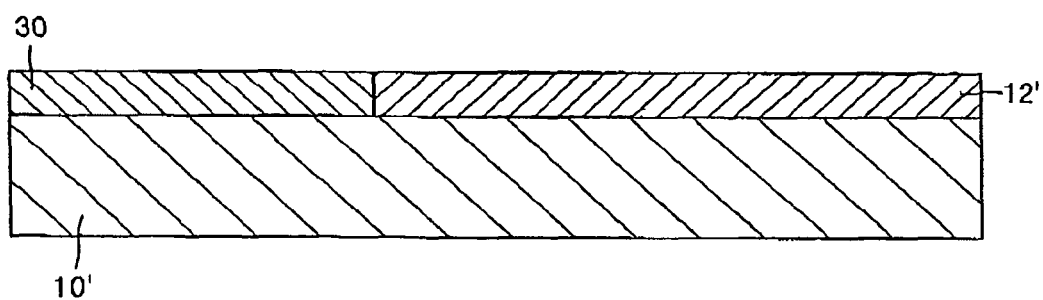

Referring to FIG. 15, a selective epitaxy process may then be performed to form monocrystalline silicon layer 30. The selective epitaxy process may be as described above and may be performed until the thickness of a monocrystalline silicon layer 30 is grown equal to the thickness of the silicon oxide film 12'.

Figure 16:
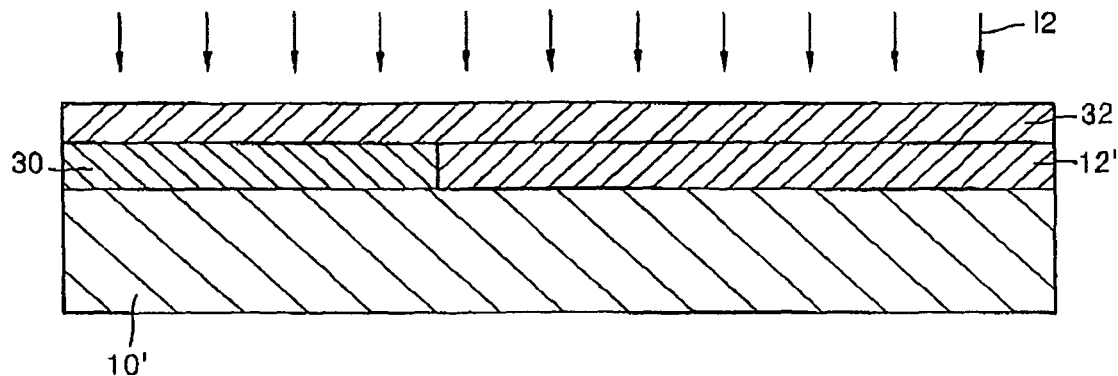

Referring to FIG. 16, an amorphous silicon layer 32 may be formed on the monocrystalline silicon layer 30 and the silicon oxide film 12'. The amorphous silicon layer 32 may be formed and ion doped 12, as indicated by ion doping process I2, as described above. A solid phase epitaxy process may be performed with respect to the ion doped amorphous silicon layer 32. The monocrystalline silicon layer 30 may be grown vertically by the solid phase epitaxy process such that the amorphous silicon layer 32 formed on the monocrystalline silicon layer 30 is crystallized. Thus, as depicted in FIG. 17, the monocrystalline silicon layer 30 and a portion of the amorphous silicon layer 32 becomes a monocrystalline silicon layer 34 having the same height as the adjacent region of the amorphous silicon layer 32.

Figure 17:
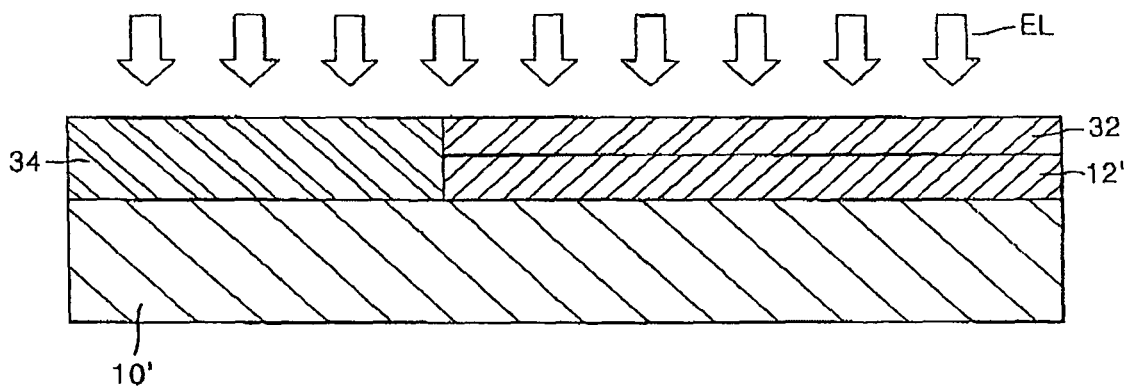
Figure 18:
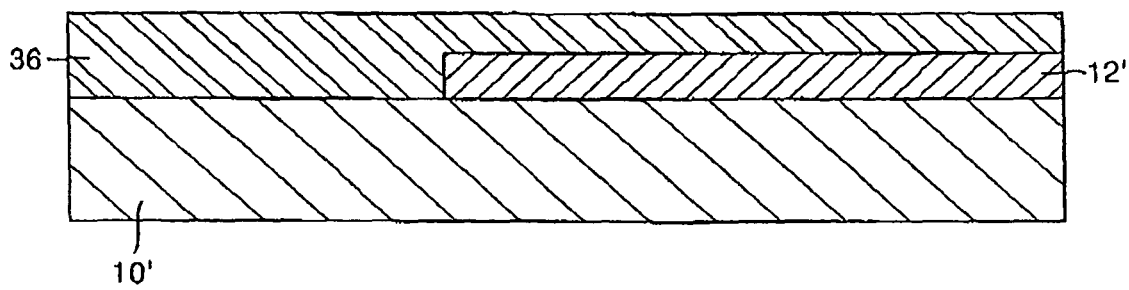

Also in connection with FIG. 17, an excimer laser EL may be used to irradiate the entire surfaces of the monocrystalline silicon layer 34 and the amorphous silicon layer 32 in the same manner as described above, such that lateral growth of the monocrystalline silicon layer 34 is achieved. The growth of the monocrystalline silicon layer 34 may be performed until all of the amorphous silicon layer 32, formed on the silicon oxide film 12', is converted to a monocrystalline structure. When the growth in the lateral direction is completed, as depicted in FIG. 18, a monocrystalline silicon layer 36 covering the entire upper surface of the silicon oxide film 12' may be formed on the sapphire substrate 10'.

Figure 19:
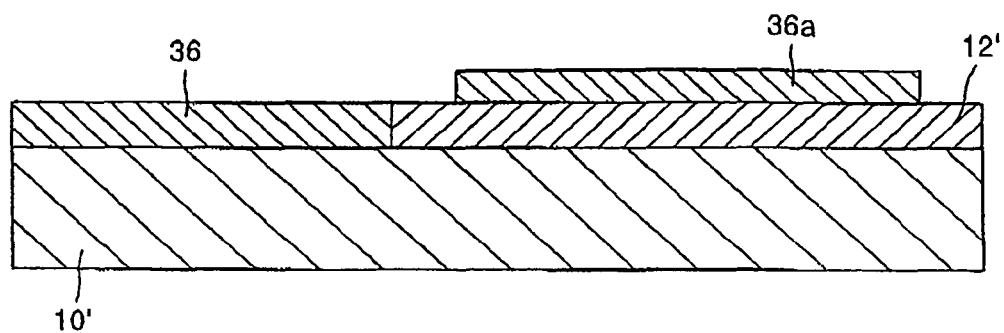

Referring to FIG. 19, a monocrystalline silicon pattern 36a (hereinafter referred to as a monocrystalline silicon island 36a) may be formed by patterning the monocrystalline silicon layer 36. The monocrystalline silicon island 36a may be formed using conventional processes, e.g., lithography, etching, etc.

Figure 20:
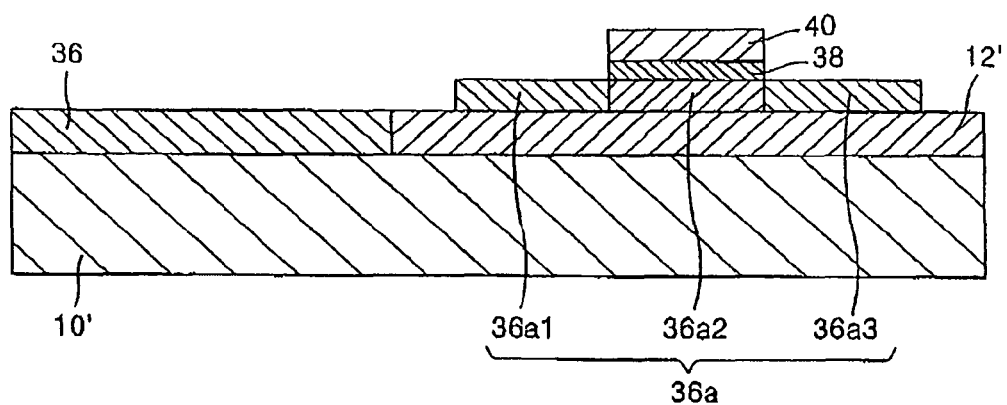

Referring to FIG. 20, the monocrystalline silicon island 36a may be divided into first, second and third regions 36a1, 36a2 and 36a3. The first through third regions 36a1, 36a2 and 36a3, respectively, may correspond to the first through third regions 20a1, 20a2 and 20a3 as shown in FIG. 1, so detailed descriptions thereof will be omitted. Formation of the TFT may include forming a gate insulating film 38 and a gate electrode 40 on the second region 36a2 and implanting a conductive dopant, e.g., an n-type or p-type dopant, into the first and third regions 36a1 and 36a3. In this way, a TFT having a source region, a drain region, and a channel region formed of a monocrystalline silicon layer on a silicon oxide film 12' may be formed on a predetermined region of the sapphire substrate 10'.

As set forth herein, a TFT according to the present invention may be formed on a transparent SOI substrate and may include a silicon oxide film formed on a predetermined region of a transparent sapphire substrate. Therefore, a TFT according to the present invention, a logic device, a memory device and a flat panel display (FPD) that requires a transparent substrate may be formed on the same substrate. Thus, a system including an FPD can be structured on an SOI substrate to provide a sapphire substrate equivalent to a system on glass (SOG). Also, a channel of a TFT of the present invention has a tensile stress applied thereto, since the channel is formed of a monocrystalline silicon layer. Therefore, a high speed operation is possible since the mobility of carriers can be increased. Also, the sapphire substrate 10, on which the TFT according to the present invention may be formed, may exhibit a thermal conductivity that is superior to that of a silicon bulk substrate. Therefore, a TFT according to the present invention may be operated more stably. Also, a TFT according to the present invention may be formed uniformly on a substrate since the TFT is formed on a monocrystalline silicon layer grown to a uniform thickness. Therefore, the integration density of a TFT according to the present invention may be higher than that of a conventional TFT. It will be appreciated that devices of various structures may be formed in keeping with the present invention, e.g., transistors, TFTs, etc.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of manufacturing a thin film transistor, the method comprising:
    providing a transparent substrate;
    forming an insulating layer on the transparent substrate, the insulating layer being in a second region of the transparent substrate;
    forming a monocrystalline silicon layer on the insulating layer;
    forming a gate insulating layer and a gate electrode on the monocrystalline silicon layer; and
    implanting a dopant into the monocrystalline silicon layer around the gate electrode,
    wherein forming the monocrystalline silicon layer on the insulating layer includes:
        forming a first monocrystalline silicon layer on a first region of the transparent substrate, the first region adjacent to the second region,
        forming an amorphous silicon layer on the first monocrystalline layer and the insulating layer,
        transforming the amorphous silicon layer into a second monocrystalline silicon layer, and
        patterning the second monocrystalline silicon layer to make an island-type second monocrystalline silicon layer on the insulating layer.

2. The method as claimed in claim 1, wherein transforming the amorphous silicon layer into the second monocrystalline silicon layer comprises:
    crystallizing the amorphous silicon layer where it overlies the first region; and
    irradiating the crystallized amorphous silicon layer overlying the first region and the amorphous silicon layer overlying the second region.

3. The method as claimed in claim 2, wherein crystallizing the amorphous silicon layer where it overlies the first region is performed by vertical solid phase epitaxy.

4. The method as claimed in claim 2, wherein irradiating the crystallized amorphous silicon layer overlying the first region and the amorphous silicon layer overlying the second region causes lateral crystallization into the amorphous silicon layer overlying the second region.

5. The method as claimed in claim 1, wherein forming the amorphous silicon layer on the first monocrystalline layer and the insulating layer comprises forming the amorphous silicon layer to a thickness such that a thickness of the second monocrystalline silicon layer where it overlies the second region has a thickness of up to about 100 nm.

6. The method as claimed in claim 1, wherein forming the insulating layer on the transparent substrate comprises:
    forming a recess in the second region of the transparent substrate; and
    filling the recess with the insulating layer.

7. The method as claimed in claim 1, wherein forming the insulating layer on the transparent substrate comprises:
    forming the insulating layer in the second region so that it projects above the first region of the transparent substrate.

8. The method as claimed in claim 1, wherein the insulating layer is one of a silicon oxide film and a nitride film.

9. The method as claimed in claim 1, wherein the transparent substrate is a sapphire substrate having a (1102) face as an upper surface.

* * * * *